United States Patent [19]

Daley et al.

[11] Patent Number: 4,635,666
[45] Date of Patent: Jan. 13, 1987

[54] BATCH CLEANING APPARATUS

[76] Inventors: Frank E. Daley, 2001 83rd Ave. North #4031, St. Petersburg, Fla. 33702; Richard H. Wilhelm, P.O. Box 5742, Clearwater, Fla. 33518

[21] Appl. No.: 725,989
[22] Filed: Apr. 22, 1985
[51] Int. Cl.$^4$ .............................................. B08B 3/02
[52] U.S. Cl. ..................... 134/172; 134/95; 134/199
[58] Field of Search ............ 134/94, 95, 100, 102, 134/172, 175, 99, 173, 174, 198, 199, 200

[56] References Cited

U.S. PATENT DOCUMENTS

| | | | |
|---|---|---|---|
| 2,634,737 | 4/1953 | Rowe | 134/152 X |
| 3,012,921 | 12/1961 | Vaughan | 134/102 X |
| 3,598,130 | 8/1971 | Nolte et al. | 134/172 X |
| 3,998,388 | 12/1976 | Alagna | 134/172 X |
| 4,076,033 | 2/1978 | Busse et al. | 134/172 |
| 4,132,567 | 1/1979 | Blackwood | 134/102 X |
| 4,286,541 | 9/1981 | Blackwood | 134/102 X |
| 4,406,297 | 9/1983 | Walton | 134/102 |

FOREIGN PATENT DOCUMENTS 1461005  12/1966  France ................ 134/172

Primary Examiner—Harvey C. Hornsby
Assistant Examiner—Frankie L. Stinson
Attorney, Agent, or Firm—Ronald E. Smith; Miguel A. Valdes

[57] ABSTRACT

An apparatus that cleans printed wiring assemblies. A plurality of assemblies are positioned in a rack on their respective edges so that each of them is maintained in a substantially vertical plane. A spray header member mounted for reciprocation between an uppermost and a lowermost position has a plurality of horizontally disposed support members that are positioned in staggered relation to the assemblies to be cleaned so that when the header member travels downwardly, the support members enter into the spaces between the rows of assemblies. A plurality of nozzles are formed on the support members, and direct a fan-shaped spray onto the assemblies both during the downward travel time of the spray header member and its upward travel time. The spray impinges the assemblies at a forty five degree angle. Depending upon the cycle being undergone, the nozzles discharge a caustic cleaning solution, domestic potable water, or a dionized water rinsing solution. If required, a solvent type cleaning solution may be used alone or jointly with the aqueous cleaning solution. The apparatus includes a separate hot air distribution system.

11 Claims, 9 Drawing Figures

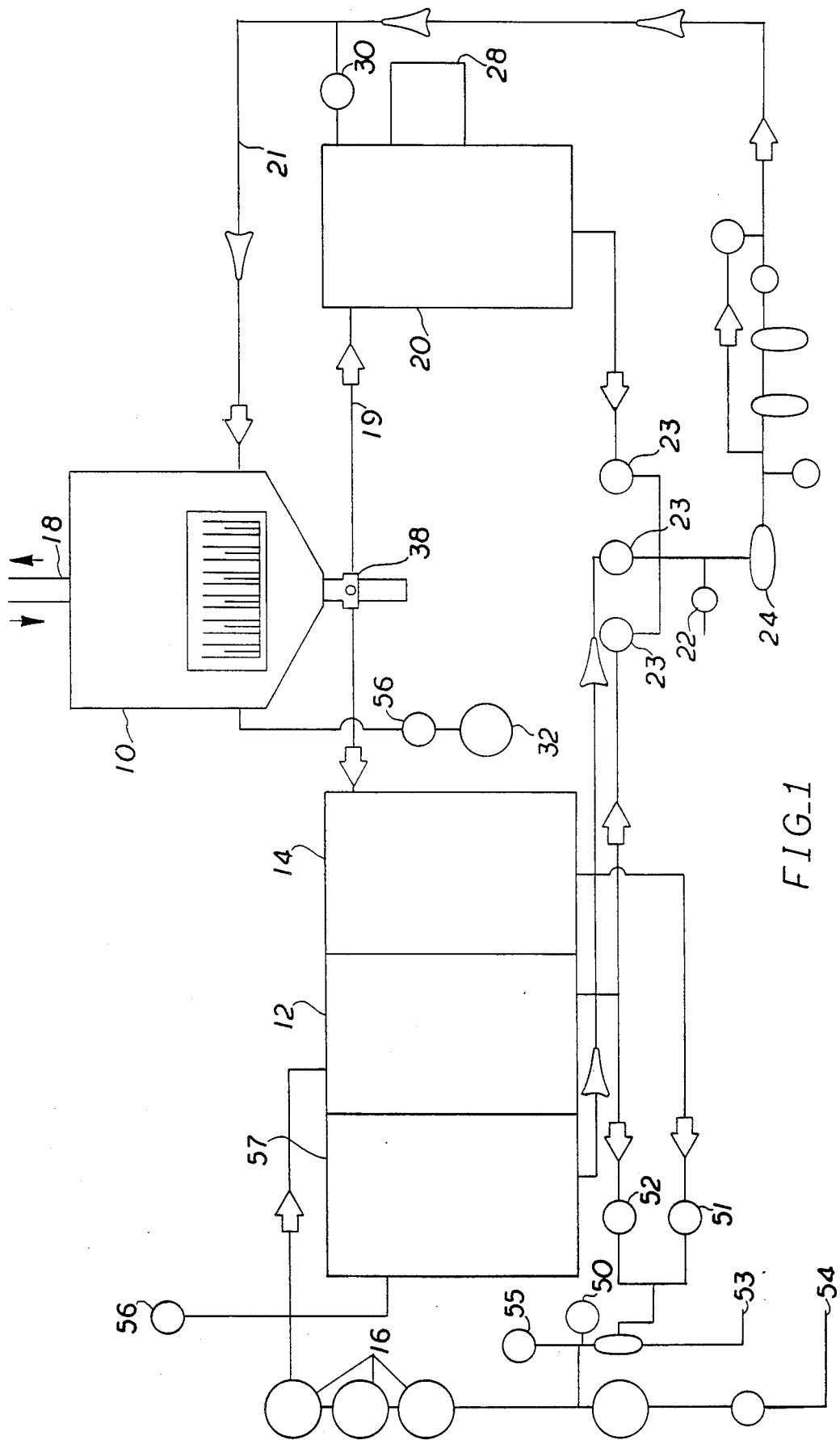
FIG_1

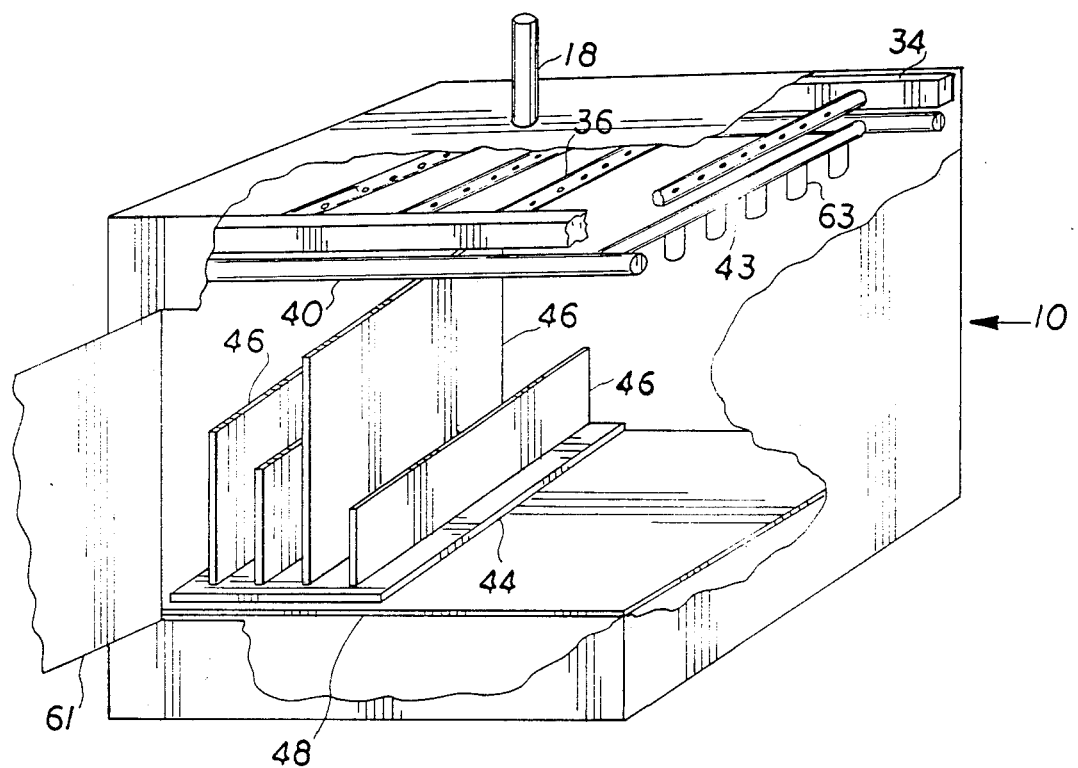
FIG_2

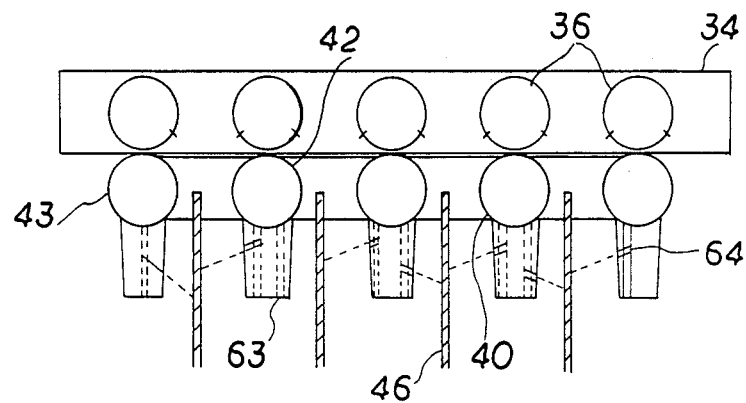
FIG_3
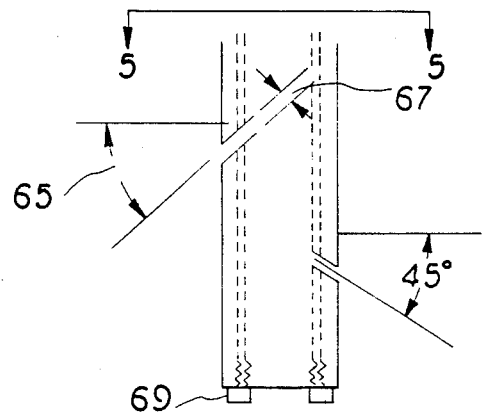
FIG_3A
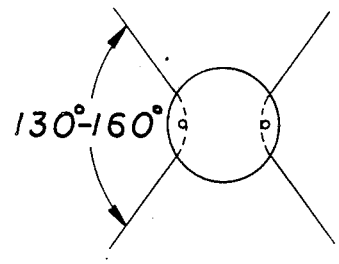
FIG_5

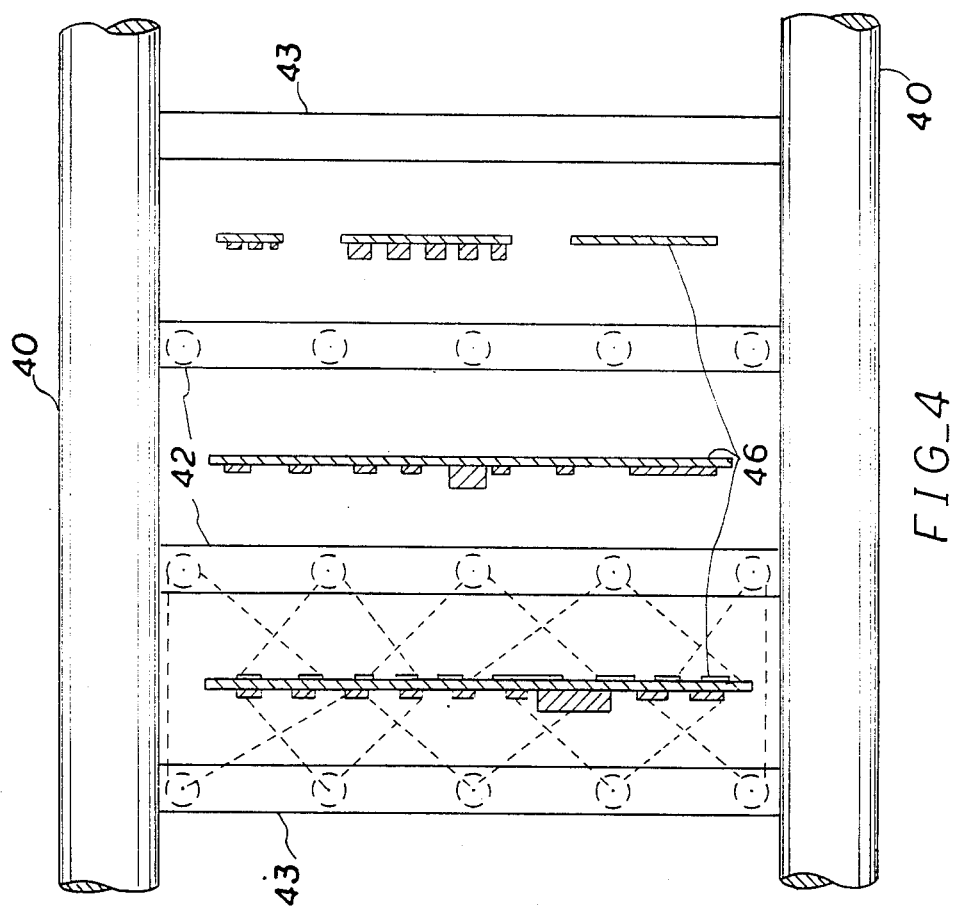

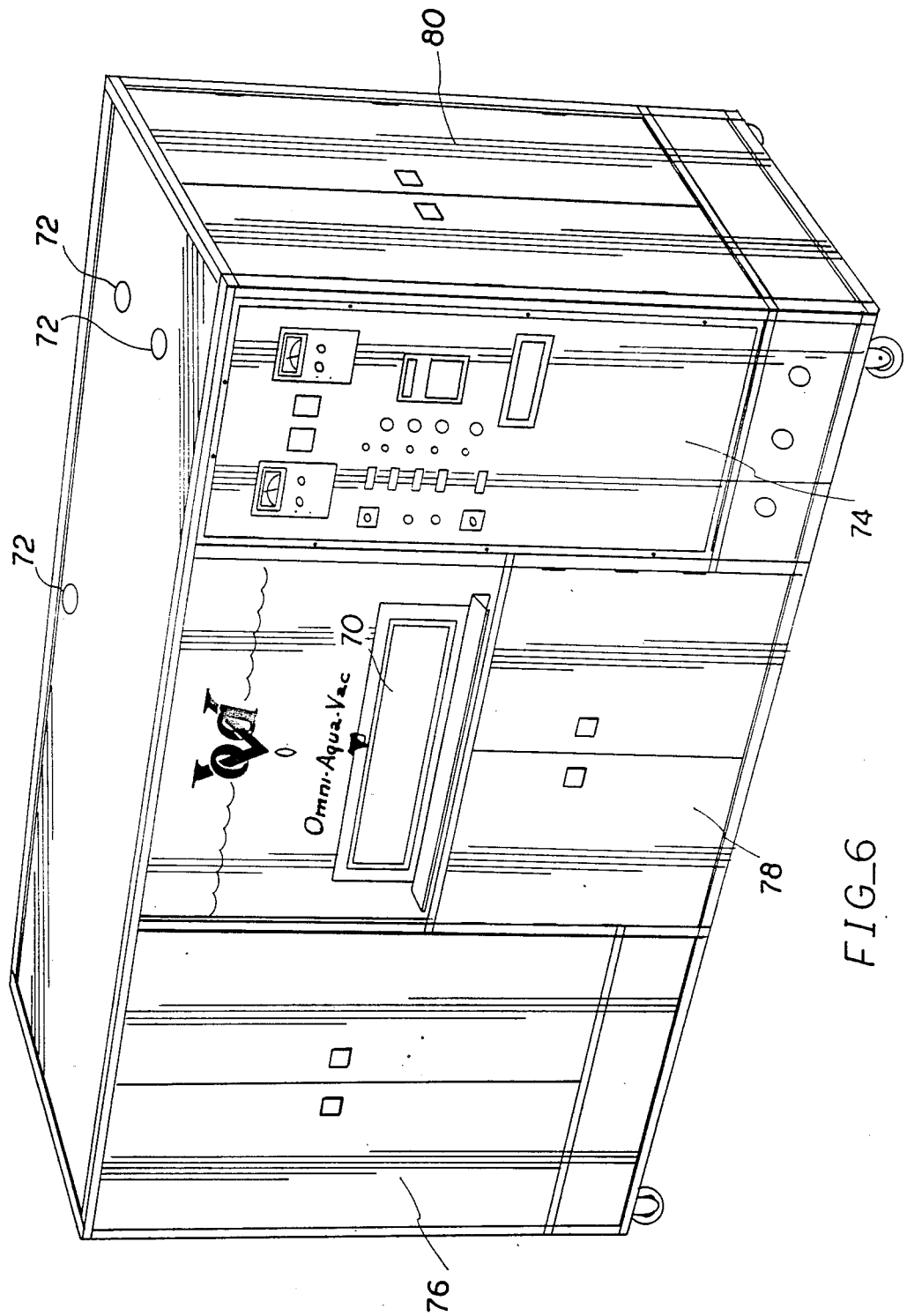

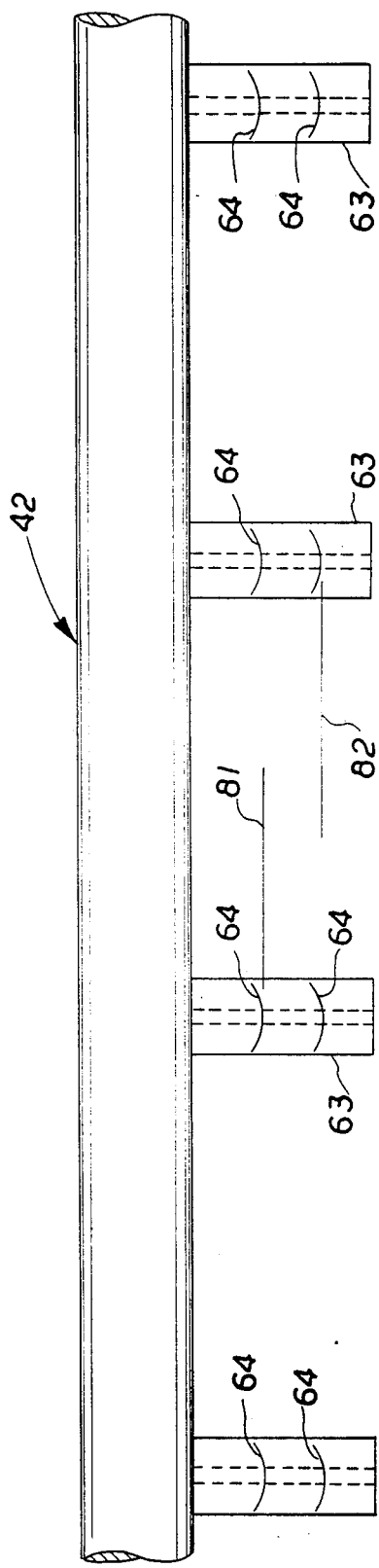
FIG_7

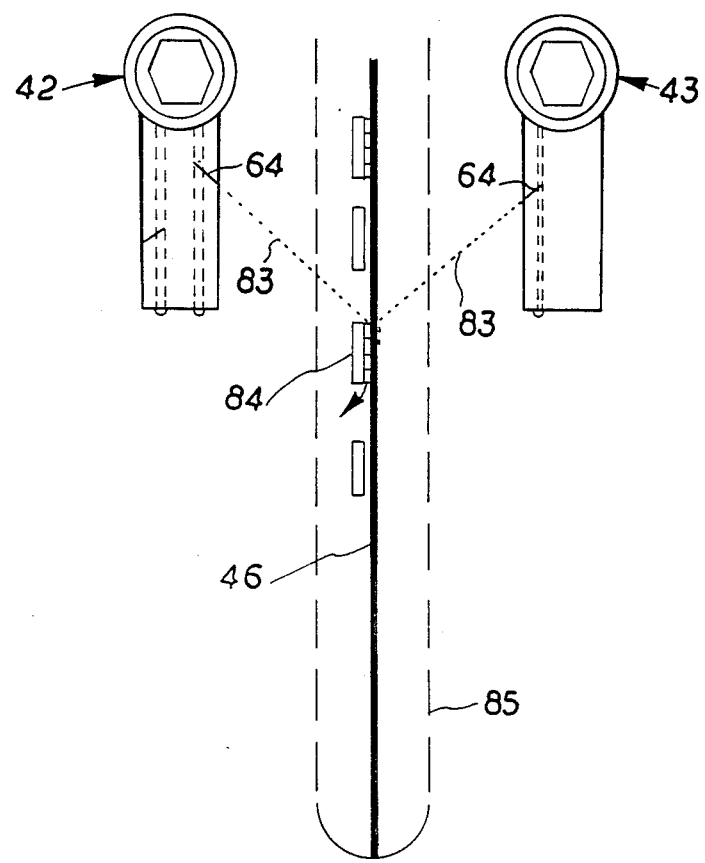
FIG_8

BATCH CLEANING APPARATUS

BACKGROUND OF THE INVENTION

1. Field of the Invention

This invention relates to batch cleaning apparatus, and more particularly, to an apparatus for cleaning printed wiring assemblies and similar articles in a batch fashion.

2. Description of the Prior Art

Apparatus that could be used to clean articles such as printed wiring assemblies, in a batch fashion, are known in the art. "Printed Wiring Assemblies" signifies all types of assemblies whether they be referred to as printed circuit boards, surface mounted components or thick film hybrid circuit assemblies.

A device that washes baking pans and that includes a rack for supporting the articles to be washed, spray nozzles and means for moving the nozzles between the rows of articles is shown and claimed in U.S. Pat. No. 3,598,130 issued Aug. 10, 1971 to Nolte and others. However, the flow of water from the nozzles of the Nolte device is not a directed flow. Thus, the water could not be directed into the very narrow spaces, of the type existing on printed wiring assemblies, between the back side of the electronic components and the adjacent surface of the assemblies.

U.S. Pat. No. 3,868,272, issued Feb. 25, 1975 to Tardoskegy, discloses a cleaning apparatus where printed circuit boards, during the cleaning operation, are supported on an endless traveling screen or perforated metal belt so that the boards are subjected to the action of cleaning fluids directed to both sides of the boards. However, this apparatus has no reciprocating spray header with nozzles capable of cleaning boards arranged in a stationary position. Consequently, its cleaning action is very limited.

U.S. Pat. No. 3,928,064 issued Dec. 23, 1975 to Holm discloses a method of cleaning plate-shaped objects by moving the objects past a tub containing a cleaning liquid and a plurality of brushes. This method is not effective to properly clean modern printed wiring assemblies, in particular, inside the narrow space between the electronic components and the adjacent surface of an assembly. The brushes are inadequate to thoroughly clean such narrow spaces.

British Pat. No. G B 2 063 414 A by Electrovert Limited, published on June 3, 1981, discloses a device having high velocity jets of cleaning liquid discharged from nozzles disposed above and below printed circuit boards carried by means of a conveyor. The boards are subjected to an additional cleaning action of liquids directed horizontally toward the boards and positioned alongside the conveyor. Nevertheless, the nozzles remain stationary and the boards move by means of a conveyor. In this device the cleaning action is limited since the jets of cleaning fluids are unable to reach every portion of the upper and lower surfaces of a board. While advancing on a conveyor, the boards are exposed only once to the cleaning action of the nozzles. Thorough cleaning and drainage of modern printed circuit boards can not be obtained with this device.

The electronic industry trend toward surface mounting of miniaturized components is creating a demand for better cleaning methods. The latest technologies made possible the manufacturing of assemblies with extremely small space between the electronic components and the adjacent surface of an assembly. This accomplishment imposes a significant hindrance to the effective cleaning of printed wiring assemblies with conventional devices. Clearly, the art of increasing the density of electronic circuits has outdistanced the art of cleaning such densely mounted circuits. Consequently, there is a present need for an apparatus capable of cleaning even the most densely packed modern printed wiring assemblies.

There are other factors that intensify the demand for perfection in the cleaning of printed wiring assemblies. The ionic and organic residues originated in the assembly stage become very destructive when activated by moisture and/or thermal electromigration. This results in chemical and galvanic corrosion and in vesication. Vesication, also known as mealing, is the formation of blisters between the interface of the protective conformal coating and the printed wiring assembly surface. By proper assembly cleaning and elimination of organic residues the moisture penetration may be sufficiently reduced. This is necessary for long term storage and operational requirements of assemblies since conformal coating is not considered a true hermetic seal.

It is, accordingly, a general object of this invention to provide an apparatus that can thoroughly clean and dry even the most modern printed wiring assemblies.

Another object of this invention is to provide an apparatus that can clean printed wiring assemblies in a batch fashion, as distinguished from the widely used conveyor belt methods of the prior art.

Another object of this invention is to provide an apparatus that can remove the ionic and nonionic residues of printed wiring assemblies.

Still another object of this invention is to provide an apparatus that can remove organic residues from printed wiring assemblies.

A further object of this invention is to provide an apparatus with jet streams capable of reaching the very narrow spaces between the back side of the electronic components or chips and the adjacent surface of a printed wiring assembly.

Still another object of this invention is to provide an apparatus with nozzles that discharge high impact, sharply defined, flat-fan pattern jet streams.

SUMMARY OF THE INVENTION

This invention accomplishes these and other objects by providing an apparatus that cleans articles, such as printed wiring assemblies, in a group or batch fashion. The novel apparatus includes an action chamber, a spray header unit with support members having nozzles formed therein which are arranged in spaced relation to one another, a holding rack to arrange the articles vertically, i.e., so that they stand in a substantially upright position on their respective edges, in rows so that jet streams from the nozzles directed downwardly at an angle exert a cleaning, rinsing, or drying action on the respective surfaces of the boards. The spray header moves within the action chamber in such a way as to advance and retract the nozzles between the rows of assemblies.

An advantage of this invention for cleaning printed wiring assemblies is that the cleaning action can reach into the extremely narrow spaces between the back side of the electronic components and the adjacent surface of the board in which they are attached.

Another advantage of this invention is that the movement of the nozzles between the rows of edge-standing assemblies coupled with a high impact, sharply defined, flat-fan or sector-shaped pattern of jet streams directed downwardly at an angle makes possible a cleaning and drainage action that reaches all portions and surfaces of the assemblies.

The highly efficient cleaning action of an apparatus made in accordance with the teachings of this invention cleans, rinses and dries conventional or complex printed wiring assemblies. The subject apparatus handles assemblies having difficult to clean portions such as sockets, connectors, flat packs, and hybrid header assemblies.

Another feature of this invention is that variable board assembly configurations can be accommodated for cleaning, simply by changing the spacing between the nozzle-carrying support members of the spray header.

The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which:

FIG. 1 is a schematic illustration of an apparatus for cleaning printed wiring assemblies according to the present invention;

FIG. 2 is a schematic perspective view of one possible embodiment of the action chamber of an apparatus according to the present invention;

FIG. 3 is a schematic sectional view of a spray header illustrating the position of the liquid and air nozzles.

FIG. 3A is an enlarged view of a nozzle housing in the spray header;

FIG. 4 is a schematic plan view illustrating the position of the spray header and the assemblies to be cleaned during the advancing and retracting action of the spray header;

FIG. 5 is a diagrammatic representation of the fan-shaped discharge pattern of the nozzles of the present invention, taken along line 5—5 of FIG. 3A;

FIG. 6 is a perspective view of the cabinet that houses the apparatus;

FIG. 7 is a schematic sectional view of a support member of a spray header according to the present invention; and FIG. 8 is a schematic sectional view illustrating the position of the support members in relation to the assemblies to be cleaned.

Similar reference numerals refer to similar parts throughout the several views of the drawings.

DETAILED DESCRIPTION OF THE PREFERRED EMBODIMENT

Referring now to FIG. 1, it will there be seen that reference numeral 10 denotes an action chamber where washing, rinsing, and drying of the assemblies take place, in sequence. For the cleaning operation (the first cycle of the machine), the apparatus of FIG. 1 uses a solution capable of effectively removing ionic, non-ionic and organic residues on the assemblies simultaneously. Other solutions known in the art, such as halogenated hydrocarbons, aqueous solutions and azeotropic solvents, are believed to have a partial and limited cleansing action on the assemblies. Accordingly, the highly caustic (Ph 13) solution used in conjunction with this apparatus is specifically formulated to remove fluxes and plating salts, rosin, oil, fingerprints and some waxes from the assemblies. In addition, it is disposable through conventional sewage systems and is biodegradable.

Still making reference to FIG. 1, chamber 10 has a sloping drain at its bottom as illustrated to facilitate either discharge or re-cycling of the used liquids at the end of the cleaning operation. The caustic solution used for the wash cycle of the apparatus is stored in detergent wash tank 20. The solution is fed to the action chamber 10 through conduit 21, and returns to the tank 20 through conduit 19 to be re-used and reconcentrated as required if its quality is acceptable. More specifically, before the wash solution can be used to clean the printed wiring assemblies, it must meet the following criteria so that the processor allows the action to begin:

1. Specified wash temperature
2. Wash concentration strength within specified limits, as measured by a conductivity probe mounted in the continuous recirculating line. This line uses a circulating pump to draw wash solution from wash tank 20 and returns. This probe continuously senses water quality and is monitored by a digital readout controller. Whenever the quality drops below a predetermined threshold the controller activates a concentration pump to feed solution to the wash solution until that threshold is reached again. The controller will inhibit the wash cycle if the concentration is too low or too high.
3. Specified water level.

Wash tank 20 includes a heater to control liquid temperature, and a high and low level control as well. The control means continually adjusts the temperature and level of the solution to keep such parameters within the acceptable limits. The operator of the machine cannot change the parameters without knowing the codes that grant access to the programmable controls, so the critical maintenance of the quality, temperature, concentration, and level of the caustic solution is essentially not subject to operator adjustment. A domestic water re-supply valve or make-up valve 30, which is also under the control of a programmable controller, is employed to accomplish the above-mentioned water level adjustment. An automatic titration device or solution concentrator 28 is in fluid communication with the wash tank 20 and is operative to maintain the alkalinity of the wash solution by adding concentrated caustic solution thereto when stimulated to do so by the programmable controller which in turn is stimulated by a suitable sensing device, as aforesaid.

The operator of the apparatus may determine the number of times with which the spray header reciprocates, although the controller prevents the operator from calling for more than a certain minimum number of "passes" of the assemblies by the spray header.

After the pases have been completed, a compressed air valve is activated by the controller to purge all lines to prevent cross-contamination of such lines. The domestic rinse water cycle follows. This water is contained in a domestic water rinse tank 57 having a capacity of 25 gallons. This water is potable, preferably having no more than 6 grains of hardness per gallon. The domestic rinse water cycle rinses the excess wash solution after the wash cycle is complete. Subsequently this water is directed to the plant drain. A compressed air valve is again activated to purge the lines and headers of water.

The next cycle is a deionized rinse cycle. A supply tank 12 of deionized water is supplied with water from a deionizing source 16. Tank 12 includes a high/low level control, a deionized-water sensing probe and a weir overflow. A deionized-water return tank 14 collects the returning deionized water from the action chamber 10. During the deionized rinse cycle the returning deionized rinse water is directed into the deionized return tank 14. The returning water activates a low level deionized return tank float switch, which when activated opens a valve 51 and energizes a deionized pump 53. The water quality is sensed by a sensor 50. A deionized meter control evaluates the quality from sensor 50 and directs the returned water to be reconditioned at source 16 or the water is directed to a waste drain by valve 55. If the returned deionized water is dumped to the drain, a water make-up valve 54 opens to resupply the deionized supply tank 12. If tank 12 is full, valves 54 and 51 close. A valve 52 opens and pump 53 activates so that sensor 50 senses the quality of water in the deionized supply tank 12. Pump 53 operates for one minute if water quality is satisfactory or will continue to regenerate until proper quality is achieved.

Pump 24 receives the proper solution from tanks 12, 20 and 57. A four position programmed ball valve 38 directs these solutions to the proper return, (i.e., wash solution and domestic rinse to the drain and deionized return water to tank 14). The entire operation is under the control of a programmable controller which receives its information from various sensors, as aforesaid. The various liquids are directed into the circulating pump 24 by means of supply valves 23. After each cycle, as aforesaid, all conduits are purged by an air purge 22 to reduce cross-contamination of the washing, rinsing and deionizing solutions.

An air blower 32 is in fluid communication with the action chamber 10, which blower is used in the drying cycle of the apparatus after the rinsing cycle ends. Intake filtration of blower 32 prevents particulates from flowing onto the cleaned assemblies.

FIG. 2 illustrates the action chamber 10 of a cleaning apparatus embodying the invention. Chamber 10 includes a holding rack support 48 to allow the installation inside chamber 10 of holding racks 44 that hold printed wiring assemblies 46, and a sealed door 61. The action piston 18 supports a spray header 40 that includes support members 42 (not shown in this figure) and 43. A plurality of spraying nozzles 63 arranged in spaced relation on support members 42 and 43 discharge liquid at a predetermined angle on both surfaces of the assemblies simultaneously. This insures total coverage of the assemblies to be cleaned. The racks 44 hold the assemblies 46 in a vertical position, arranged in rows. Adequate spacing is provided between the rows to allow vertical movement of the header 40 between the rows of assemblies to be cleaned.

The inside support members 42 have two slots on each nozzle and the two outside support members 43 have only one slot per nozzle. The spray header 40 is supported by action piston 18 which drives the entire header 40 assembly vertically between the rows of assemblies. Guide rods at each corner of the spray header 40 stabilize this movement. In the preferred embodiment of this apparatus, an assembly surface is placed within one inch (1") of the spray discharge. The action piston 18 is the prime force that drives the header 40 on a reciprocating vertical motion from top to bottom and vice versa. Piston 18 may operate from the bottom or from the top depending on the stroke required for each application. Piston 18 may be pneumatically or hydraulically operated by a motor driven linear actuator.

FIG. 3 illustrates the position of the nozzles on support members 42 and 43 with respect to the assemblies 46 to be cleaned. On the inner support members 42, two (2) slots are provided per nozzle at ninety (90) degrees from each other so that the jet streams from each nozzle impinge a surface of an assembly at 45 degrees from the vertical. Support members 43, which are the outer members, have only one nozzle formed therein per position, at forty five (45) degrees from the horizontal. The jet streams from the nozzle of any member 43 at any position will impinge a surface of an assembly at forty five (45) degrees from the vertical. Since support members 43 are the outside members of the spray header 40, the jet streams spraying pattern is confined to the area occupied by the assemblies held on racks 44. This feature assures a concentrated cleaning action and minimizes the unnecessary outside spreading of the cleaning liquid, at the same time minimizing scum build-up on the inside of the action chamber 10.

FIG. 3 also shows a hot air drying system that consists of a separate hot air distribution header 34, which is mounted above the liquid spray header 40. Header 34 comprises support members 36 running parallel with support members 42 and 43 and having a plurality of slots cut into said members 36. These slots discharge hot air at a 45 degree angle, approximately, onto the surface of the printed wiring assemblies. This air tends to blow off the excessive moisture from the printed wiring assemblies and vaporize the remaining moisture.

As shown in FIG. 3A, the slot width 67 may vary according to the pressure, flow or degree of atomization needed for proper penetration of the various printed wiring assemblies. The slot inclination angle 65 may also vary from the same aforesaid reasons. Removable cap screws 69 are provided for cleaning of the nozzles.

As shown in FIG. 4, the support members 42 and 43 of the spray header 40 are positioned between the printed wiring assemblies 46 during the vertically advancing and retracting movement of the spray header 40 to allow the impinging of the jet streams on the surfaces of assemblies 46.

FIG. 5 shows the fan-shape (or sector-shape) of the spray pattern of the liquid from the nozzles. The preferred spray angle is dependent upon the printed wiring assemblys' configuration. It will depend also on the proximity of the nozzles to each other and the distance of the nozzle to the printed wiring assemblies. The pattern of the spray is the same for the caustic solution, the domestic rinse and the deionized water rinsing solution. In this embodiment the spray angle varies between 130 and 160 degrees.

The operation of the machine is believed to be apparent from the above-description. All the machine operator need do is to activate the machine. The programmable controller will not allow the cycles of the machine to begin until it has monitored all of the various sensors throughout the system. A visual read-out will provide information to the operator concerning the state of the various machine conditions that are preventing commencement of machine operation. For example, after an operator activates the machine, the read-out might say "wash solution temp low" or words to that effect. The operator need not take any action to bring the out-of-bounds condition or conditions into acceptable limits, as each function of the machine is entirely self-monitoring and self-adjusting.

When all of the monitored states are acceptable, the first cycle will begin. As aforesaid, the first cycle is the washing cycle, and the operator may adjust the number of sweeps of the spray header past the assemblies, but not above a certain preselected maximum. During the washing action, the temperature, level and concentration of the caustic solution in the wash tank are continually monitored and adjusted by the controller as needed. Wash water that has not become overly contaminated will be re-cycled as the solution is relatively expensive, and such wash solution is not discarded until after its ability to clean has gone below a predetermined threshold.

The lines are purged by air after the wash cycle has ended, and the rinsing cycle then begins unless the operator re-starts the wash cycle such as may be done where extremely soiled assemblies are being cleaned.

The deionized water used in the rinse is an ion acceptor and removes ions from the assemblies. Thus, the assemblies are understood to be ion donors. As in the previous cycle, the deionized water is continually recycled until its quality falls below a predetermined threshold. The preferred method of testing the quality of the deionized water is to measure its resistivity.

After another air purge, the drying cycle begins. The presence of moisture on sophisticated printed wiring assemblies cannot be tolerated, as the presence of moisture stimulates corrosion and other undesireable phenomena, as mentioned above.

The machine is designed for two modes of operation: (1) Fully automatic, whereby the operator need only to activate the automatic sequence and the machine will perform all sequences necessary (wash-domestic rinse, deionized rinse, dry) and shut down after the drying cycle. (2) Manual operation, whereby the operator can select any one of the machine operations. In this mode only that sequence operates and the machine automatically stops after the purge is complete in that selection function. Even in the manual operation mode all the pre-programmed parameters must be met before the sequence operates. If for any reason the machine needs to be stopped, it is only necessary to press a cancel button and the machine completely shuts down. The header automatically retracts to its full up position when a shut down has occurred.

FIG. 6 is a perspective view of the apparatus within its cabinet. It is entirely portable, being movable on casters as shown in the Figure. The dimensions of a commercial embodiment of the machine are approximately ten feet (10') long, four feet (4') wide, and six feet (6') high. The cabinet comprises a chamber door 70, airvents 72, a control panel 74, an access door 76 for the deionized water treatment, an access door 78 for the caustic storage and an access door 80 for the control equipment. The machine requires only four (4) external hook-ups, to wit: (1) a domestic water supply to provide make-up water for the wash solution tank 20, the tank 57 domestic water rinse and the tank 12 deionized supply; (2) an electrical hook-up to a 240 VAC outlet and/or 460 VAC outlet to power the circulating pump 24, air blower 32, controllabe programmer, auxiliary heater to boost the temperature of the drying air discharged by the blower 32 before it enters the action chamber 10 and the heater for the wash solution (3) a hook-up to an external 80 psi compressed air supply; and (4) a drain to a sewer.

As shown in FIG. 7, the slots 64 of nozzles 63 are positioned alternately at different elevations so that the spray pattern of the slots of adjacent nozzles will not interfere with each other. In FIG. 7 two slots 64 are positioned at elevations 81 and 82.

As shown in FIG. 8 the path of streams 83 of slots 64 are illustrated. Stream 83 reaches into the space between chips 84 and the side in which chips 84 are attached to printed wiring assembly 46. Assemblies 46 are held vertically by means of a steel rod frame 85.

The subject apparatus has been tested and found to be capable of substantially out-performing any assembly cleaning device known to the art.

It will thus be seen that the objects set forth above, and those made apparent by the preceeding description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,
What is claimed is:

1. An apparatus for cleaning articles, such as printed wiring assemblies, in a batch fashion, comprising:
   an action chamber having enclosing walls,
   a spray header assembly arranged for vertical movement within said action chamber walls,
   guide means for controlling the movement of said spray header assembly,
   a plurality of elongated support members mounted in spaced rows on said spray header assembly,
   a plurality of spray nozzles arranged in spaced relation on said support members,
   a holding device for holding the articles to be cleaned, said holding device arranged to receive and hold the articles vertically in separate spaced rows, the spacing between the rows being sufficient to receive said support members in between the rows of articles to be cleaned so that said spray nozzles can move progressively along the surfaces of the articles,
   spray header controlling means for advancing and retracting said spray header inside said action chamber,
   said spray header including means for changing the spacing between said support members to allow the cleaning of assemblies having different widths,
   apparatus cycling means for operating said apparatus in a washing cycle, a rinsing cycle, a deionizing cycle, and a drying cycle,
   a purging means for purging the spray header between cycles to substantially eliminate cross-contamination between the wash, rinse and de-ionizing cycles,
   an air distribution header positioned in closely spaced relation to said spray header,
   a plurality of elongated support members mounted in spaced rows on said air distribution header,
   and said support members having a plurality of slots formed therein so that air can be blown therethrough to impinge upon and dry said articles.

2. A cleaning apparatus as recited in claim 1, wherein said action chamber includes a door on one of the walls to seal said action chamber.

3. A cleaning apparatus as recited in claim 1, wherein said spray nozzles have slots formed therein and are positioned at an angle to discharge a liquid angularly onto the surfaces of the articles, said liquid forming a spray pattern.

4. A cleaning apparatus as recited in claim 3, wherein said support members includes outer and inner support members, and wherein the slots of said nozzles on said inner support members are positioned in pairs at an angle of 90 degrees therebetween, and wherein the slots of said nozzles on said outer support members are individually positioned at an angle of 45 degrees from the vertical.

5. A cleaning apparatus as recited in claim 3, wherein the slots are positioned alternately at different elevations on said nozzles of said elongated support members to avoid interference between the spray patterns of said liquid.

6. A cleaning apparatus as recited in 5, wherein the spray angle of the spray patterns varies from 130 degrees to 160 degrees.

7. A cleaning apparatus as recited in claim 1, wherein said spray nozzles include means for discharging high impact, sharply defined, sector-shaped jet streams of means.

8. A cleaning apparatus as recited in claim 7, wherein said spray header moves said spray nozzles relative to the respective surfaces of the articles so that said spray nozzles are spaced about one inch from the surfaces of the articles.

9. A cleaning apparatus as recited in claim 1, wherein said liquid comprises a detergent solution for the washing cycle of said apparatus to remove the ionic, non-ionic and organic residues simultaneously from the articles.

10. A cleaning apparatus as recited in claim 1, wherein the slots of said support members on said air distribution header are positioned in pairs at an angle of 90 degrees therebetween and are operative to discharge said air at an angle of 45 degrees from a vertical plane onto the respective surfaces of said articles.

11. A cleaning apparatus as recited in claim 10, wherein said air comprises hot air.

* * * * *